(12) United States Patent
Ivanov et al.

(10) Patent No.: US 7,863,071 B1
(45) Date of Patent: Jan. 4, 2011

(54) COMBINED MICRO-ELECTRO-MECHANICAL SYSTEMS DEVICE AND INTEGRATED CIRCUIT ON A SILICON-ON-INSULATOR WAFER

(75) Inventors: Tony Ivanov, Summerfield, NC (US); Julio Costa, Summerfield, NC (US); Jonathan Hale Hammond, Oak Ridge, NC (US); Walter Anthony Wohlmuth, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 270 days.

(21) Appl. No.: 11/842,198

(22) Filed: Aug. 21, 2007

(51) Int. Cl.
*H01L 21/00* (2006.01)
(52) U.S. Cl. .................................................. 438/53
(58) Field of Classification Search .................. 438/622, 438/618, 612, 611, 610, 602, 585, 584, 50–53
See application file for complete search history.

(56) References Cited

U.S. PATENT DOCUMENTS

| | | | |
|---|---|---|---|
| 6,635,509 B1 * | 10/2003 | Ouellet | 438/106 |
| 6,849,558 B2 * | 2/2005 | Schaper | 438/758 |
| 7,023,065 B2 * | 4/2006 | Ayazi et al. | 257/414 |
| 7,056,757 B2 * | 6/2006 | Ayazi et al. | 438/48 |
| 2005/0206479 A1 * | 9/2005 | Nguyen et al. | 333/186 |
| 2006/0205106 A1 * | 9/2006 | Fukuda et al. | 438/52 |
| 2007/0224832 A1 * | 9/2007 | Zurcher | 438/758 |

OTHER PUBLICATIONS

Bhave et al.; Internal Electrostatic Transduction for Bulk-Mode MEMS Resonators; Jun. 6-10; Solid-State Sensor, Actuator and Microsystems Wokrshop; Hilton Head Island, South Carolina; p. 59.*

Pacheco, Sergio et al., "RF MEMS Resonator for CMOS Back-End-Of-Line Integration," Digest of Papers, Topical Meeting on Silicon Monolithic Integrated Circuits in RF Systems, Sep. 8-10, 2004, pp. 203-206.

* cited by examiner

*Primary Examiner*—Matthew W Such
*Assistant Examiner*—Ali Naraghi
(74) *Attorney, Agent, or Firm*—Withrow & Terranova, P.L.L.C.

(57) ABSTRACT

The present invention includes a fabrication method to construct a combined MEMS device and IC on a silicon-on-insulator (SOI) wafer (MEMS-IC) using standard foundry IC processing techniques. The invention also includes the resulting MEMS-IC. Deposition layers are added to the SOI wafer and etched away to form interconnects for electronic components for the IC. In one embodiment of the present invention, standard foundry IC processing etching techniques may be used to etch away parts of the insulating layer and device layer of the SOI wafer to create fine gaps and other detailed mechanical features of the MEMS device. Finely detailed etching patterns may be added by using imprint lithography instead of using contact or optical lithography.

20 Claims, 15 Drawing Sheets

COMBINED MICRO-ELECTRO-MECHANICAL SYSTEMS DEVICE AND INTEGRATED CIRCUIT ON A SILICON-ON-INSULATOR WAFER

FIELD OF THE INVENTION

The present invention relates to micro-electro-mechanical systems (MEMS) devices, integrated circuits (IC), and related fabrication methods used in the electronics semiconductor industry.

BACKGROUND OF THE INVENTION

A MEMS device includes at least one mechanical element, such as a sensor, actuator, or resonator that is formed using a micromachining process that selectively etches away parts of a wafer. The wafer may include added structural layers and may be made of a semiconductor material, such as silicon. By using a semiconductor wafer, standard foundry IC processing, such as complementary metal-oxide-semiconductor (CMOS), bipolar, and bipolar CMOS (BICMOS) may be used to add electronic components, which form an IC, to create a combined MEMS device and IC on a single wafer, which includes both mechanical elements and electronic components. However, MEMS devices may be formed before or after standard foundry IC processing using high temperature oxidation, deposition, or both. Such pre-processing and post-processing steps add complexity and cost. Some MEMS devices, such as resonators, may require very fine gaps, which may be difficult to fabricate. Thus, there is a need for a fabrication method to construct a combined MEMS device and IC on a single wafer using standard foundry IC processing techniques.

SUMMARY OF THE INVENTION

The present invention includes a fabrication method to construct a combined MEMS device and IC on a silicon-on-insulator (SOI) wafer (MEMS-IC) using standard foundry IC processing techniques. The invention also includes the resulting MEMS-IC. Deposition layers are added to the SOI wafer and etched away to form interconnects for electronic components for the IC. In one embodiment of the present invention, standard foundry IC processing etching techniques may be used to etch away parts of the insulating layer and device layer of the SOI wafer to create fine gaps and other detailed mechanical features of the MEMS device. Finely detailed etching patterns may be added by using imprint lithography instead of using contact or optical lithography. The MEMS device may take the form of any useful shape, such as a cylinder or cube. One MEMS device is a disk resonator, which when driven with electrical signals may include electrical responses useful for creating electronic circuits such as oscillators and filters. Such a MEMS device may be used in a MEMS-IC that includes radio frequency (RF) filters, which may replace surface acoustic wave (SAW) filters in some RF applications. Such a MEMS IC may include RF power amplifiers, transceiver circuits, RF switch circuits, and the like.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention includes a fabrication method to construct a combined MEMS device and IC on a silicon-on-insulator (SOI) wafer (MEMS-IC) using standard foundry IC processing techniques. The MEMS device includes at least one MEMS element. The invention also includes the resulting MEMS-IC. Deposition layers are added to the SOI wafer and etched away to form interconnects for electronic components for the IC. Deposition layers may include conducting materials, such as metals, semi-conducting materials, such as silicon, insulating materials, such as silicon dioxide, or any combination thereof. Other layers may be added to the SOI wafer prior to adding any deposition layers. Further, other layers may be added in between deposition layers. In one embodiment of the present invention, standard foundry IC processing etching techniques may be used to etch away parts of the insulating layer and device layer of the SOI wafer to create fine gaps and other detailed mechanical features of the MEMS device. Finely detailed etching patterns may be added by using imprint lithography instead of using contact or optical lithography, since contact or optical lithographic techniques may not provide the details required by the MEMS device. The MEMS device may take the form of any useful shape, such as a cylinder or cube. One MEMS device is a disk resonator, which when driven with electrical signals may produce electrical responses useful for creating electronic circuits such as oscillators and filters. Such a MEMS device may be used in a MEMS-IC that includes radio frequency (RF) filters, which may replace surface acoustic wave (SAW) filters in some RF applications. The MEMS IC may include RF power amplifiers, transceiver circuits, RF switch circuits, and the like.

Figure 1:
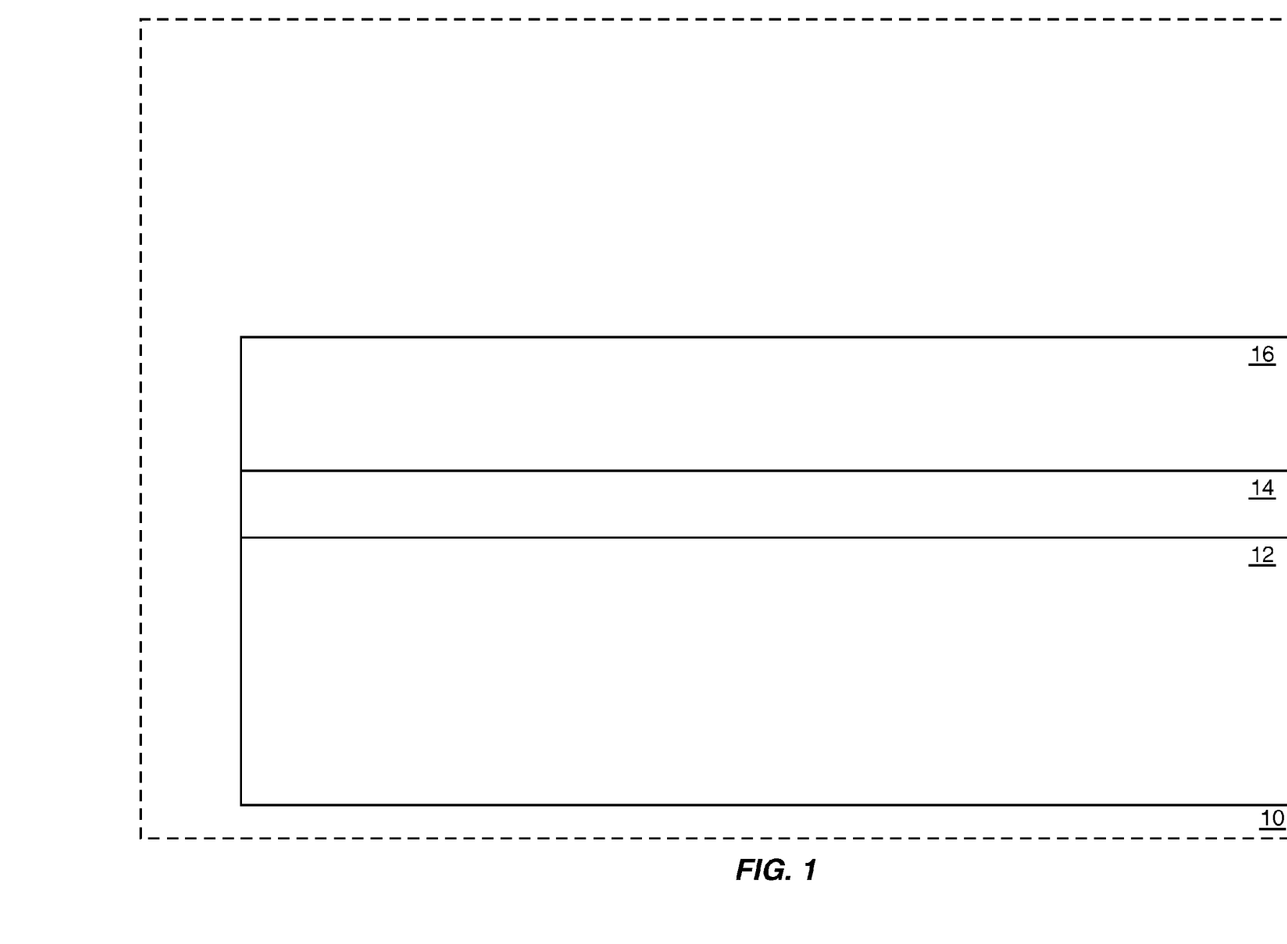
FIG. 1 shows a cross section of the layers of an SOI wafer.

FIG. 1 shows a cross section of the layers of an SOI wafer 10. The bulk of the wafer is called an SOI handle wafer 12, which provides mechanical support and rigidity, and includes a semiconductor material, such as silicon. On top of the SOI handle wafer 12 is an SOI buried oxide layer 14, which includes an insulating material, such as silicon dioxide. On top of the SOI buried oxide layer 14 is an SOI device layer 16, which includes a semiconductor material, such as silicon. The SOI device layer 16 provides material for MEMS devices, electronic components, or both. The SOI buried oxide layer 14 electrically insulates the SOI device layer 16 from the SOI handle wafer 12.

Figure 2:
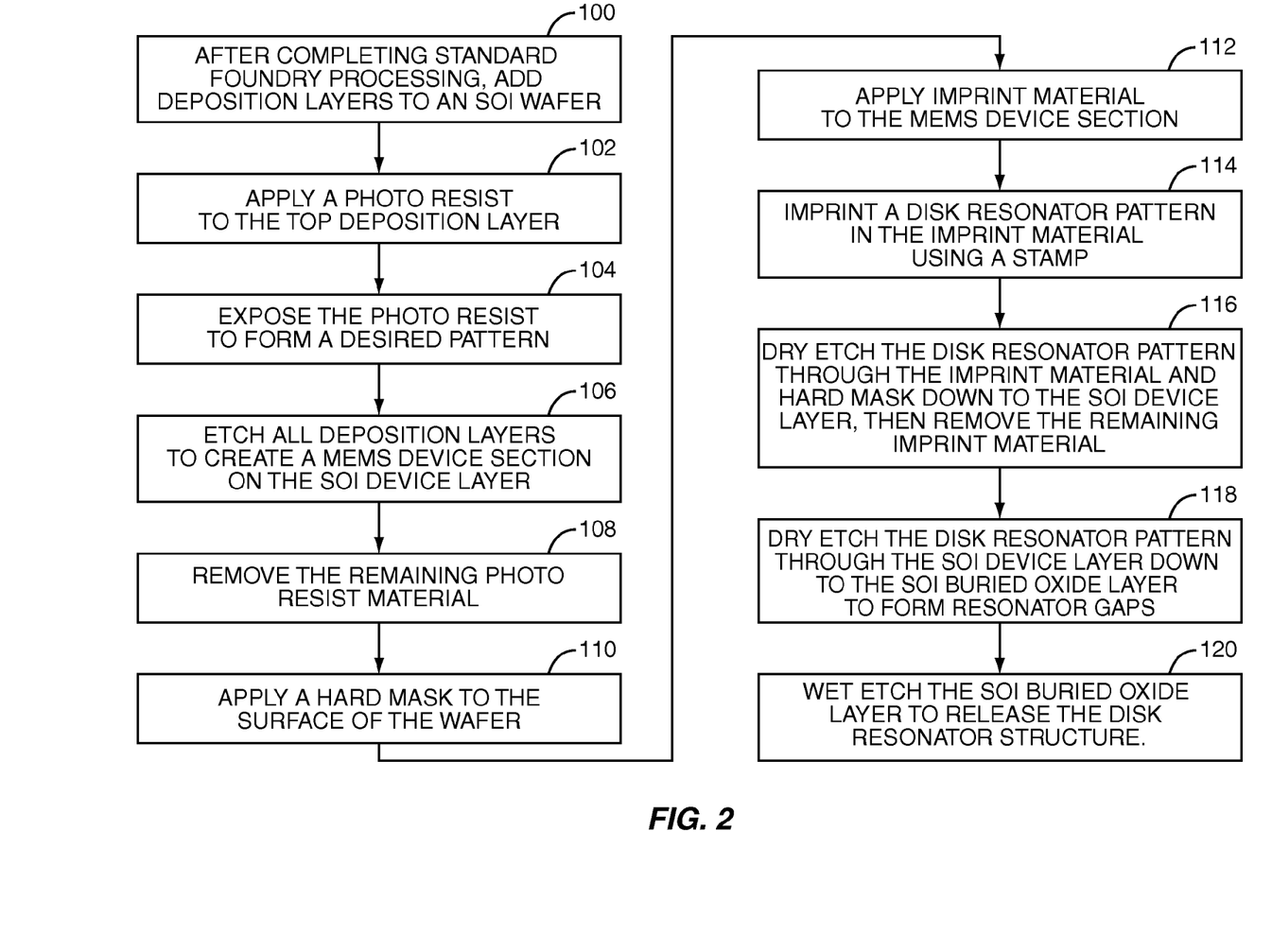
FIG. 2 shows one embodiment of the present invention, which is a process for creating a combined IC and MEMS disk resonator.
Figure 3:
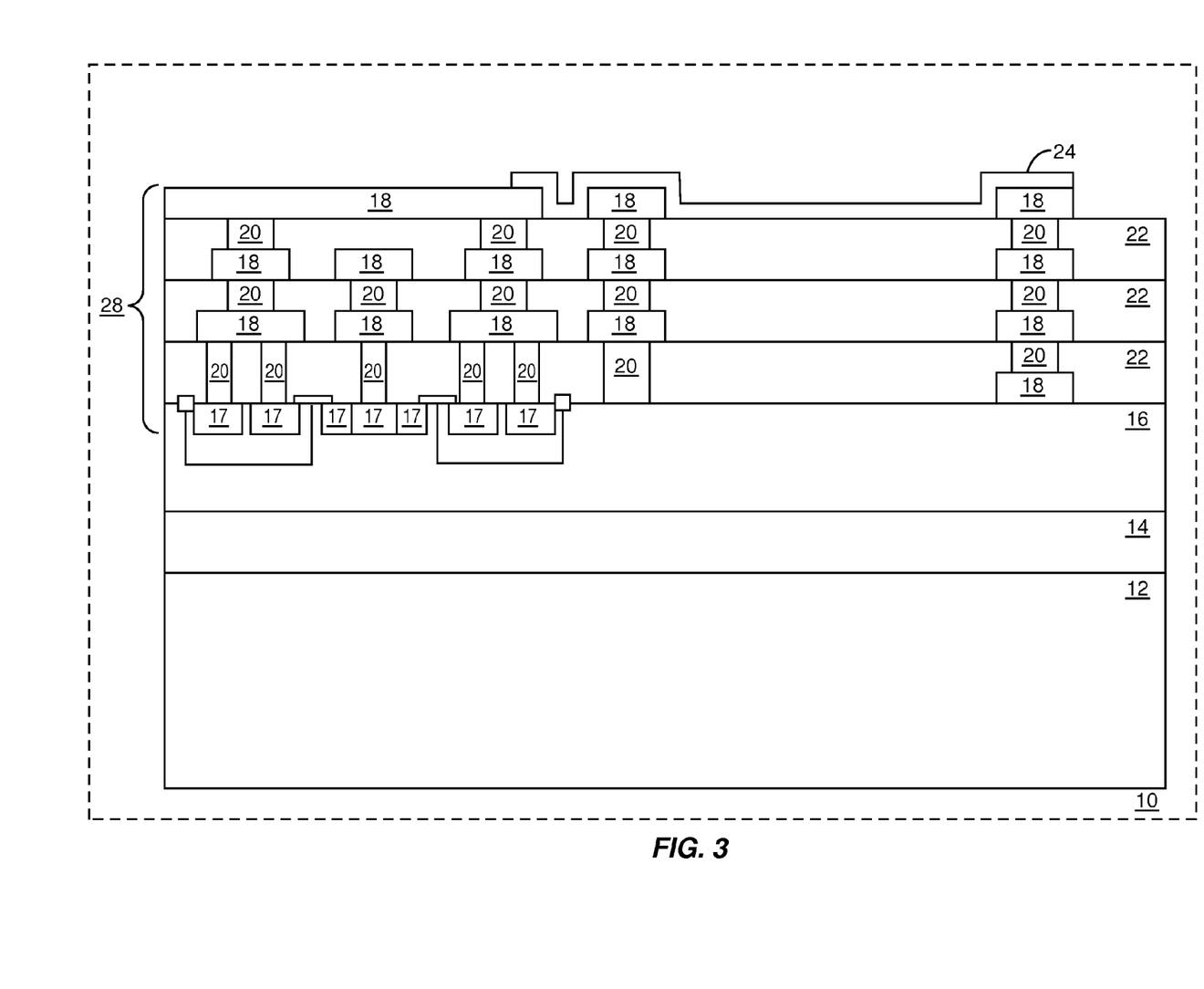
FIG. 3 shows an SOI wafer with fully functional electronic components, including interconnects, after completion of foundry processing.
Figure 4:
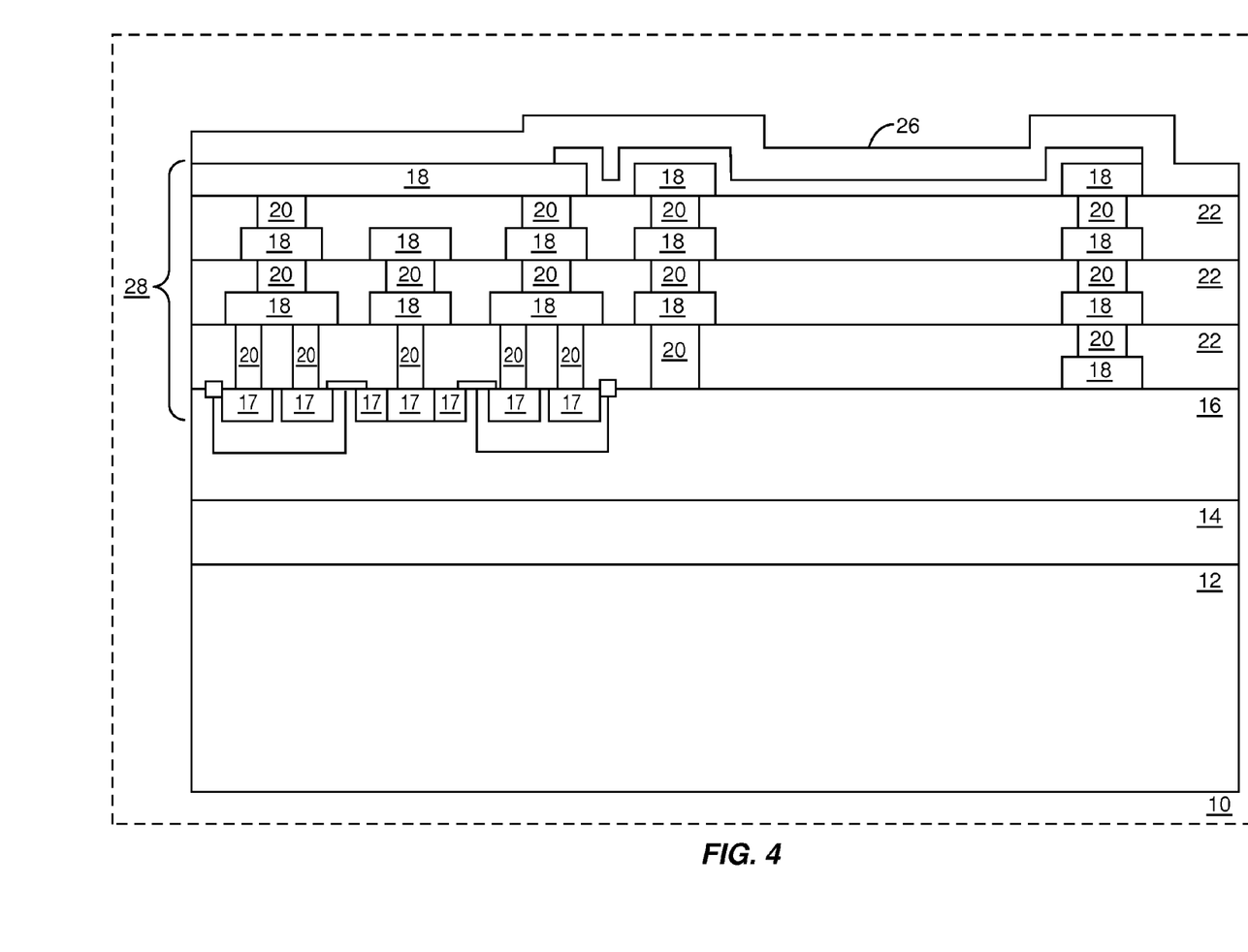
FIG. 4 illustrates the application of a photo resist material added to the SOI wafer of FIG. 3.

FIG. 2 shows one embodiment of the present invention, which is a process for creating a combined IC and MEMS disk resonator. FIG. 3 shows an SOI wafer with fully functional electronic components, including interconnects, after completion of foundry processing. The SOI device layer 16 includes targeted doping regions 17 for fabrication of specific electronic components. FIGS. 4 through 12 further illustrate the following steps. Initially, standard foundry IC processing is used to add deposition layers to the SOI wafer 10 (Step 100, FIG. 3). The deposition layers may be predominantly metallic layers, which may include metal interconnects 18, vias 20, or both. Alternatively, deposition layers may include dielectric material 22 or dielectric passivation material 24. Next, lithographic techniques, such as imprint lithography, contact lithography, or optical lithography, are used to apply a pattern into a lithography material, such as an imprint material or a photo resist material. The pattern is then etched into deposition and other layers of the SOI wafer 10. In one embodiment of the present invention, a photo resist material 26 is applied to the top deposition layer (Step 102, FIG. 4). The deposition layers may create interconnects for a transistor element 28, which is one IC component. A plurality of IC components may be created using the deposition layers, the SOI wafer 10, or both. The photo resist material 26 is then exposed to a desired etch pattern (Step 104).

Figure 5:
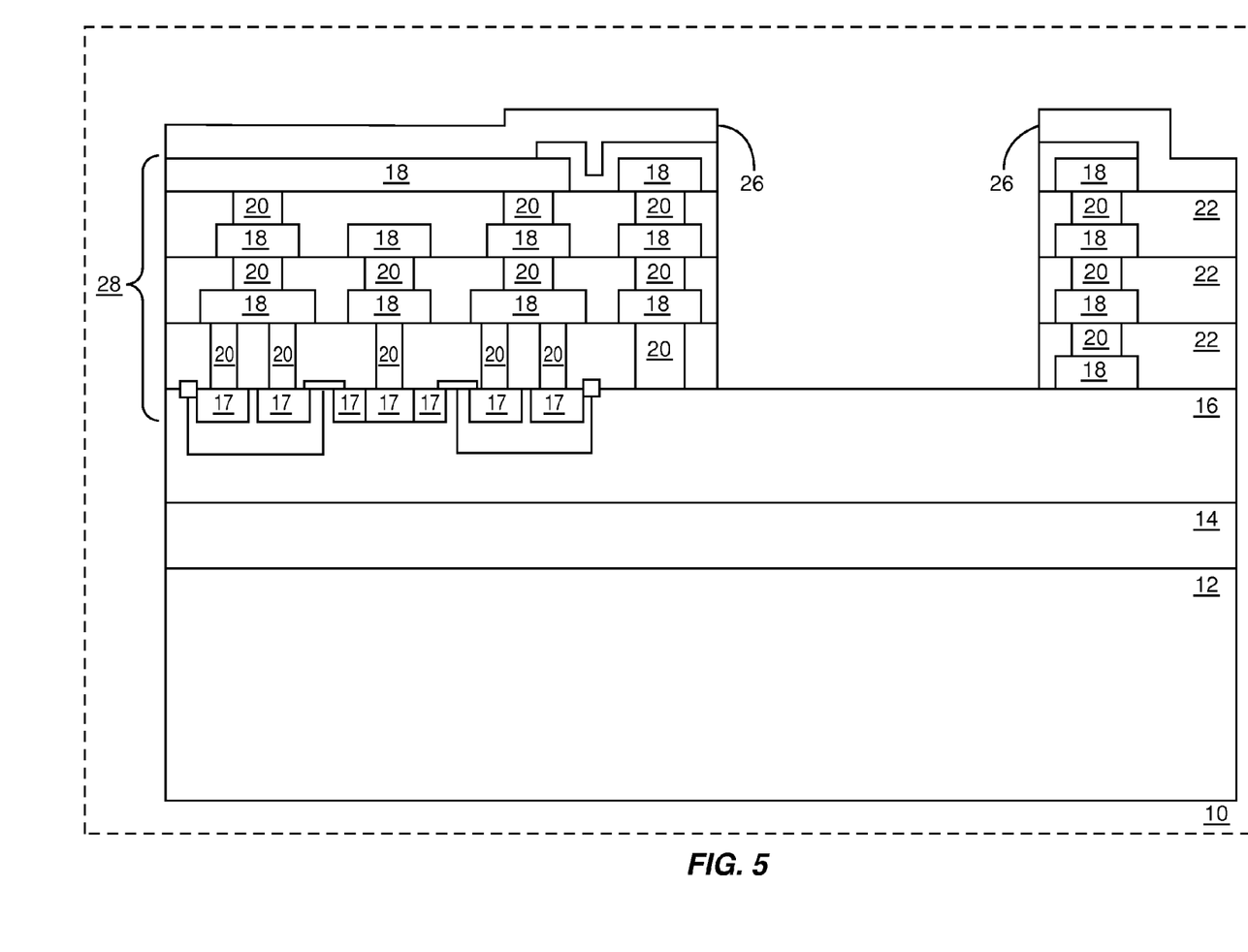
FIG. 5 illustrates the SOI wafer of FIG. 4 after etching back end layers.
Figure 6:
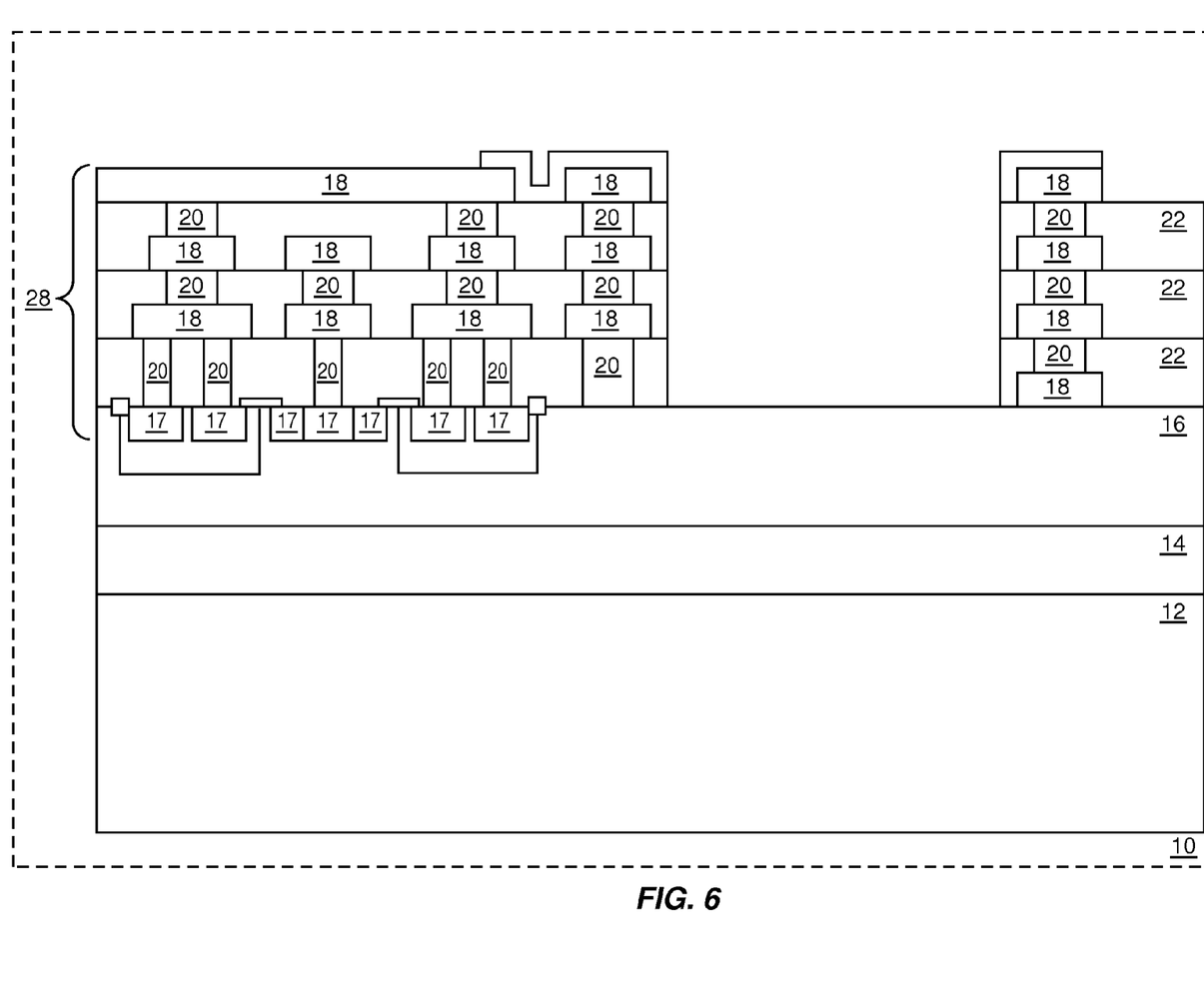
FIG. 6 illustrates fabrication of the SOI wafer of FIG. 5 after removal of the photo resist material.

All deposition layers are etched to create a MEMS device section on the SOI device layer 16 (Step 106, FIG. 5). Alternate embodiments of the present invention may use other techniques to create the MEMS device section on the SOI device layer 16. Alternate lithography materials, lithography techniques, pattern addition, and etching methods may be used. After etching, the remaining photo resist material is removed (Step 108, FIG. 6).

Figure 7:
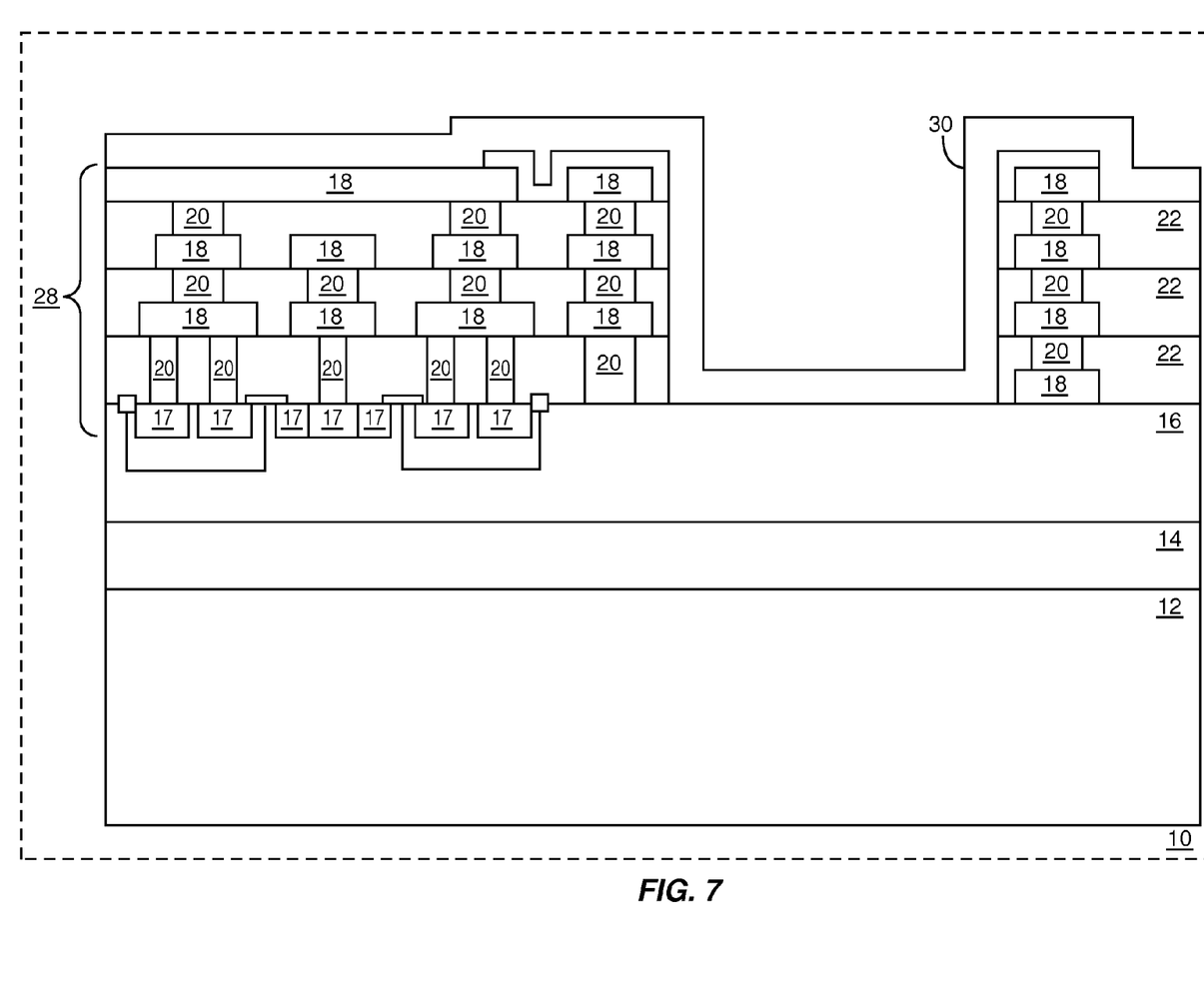
FIG. 7 illustrates fabrication of a hard mask layer added to the SOI wafer of FIG. 6.
Figure 8:
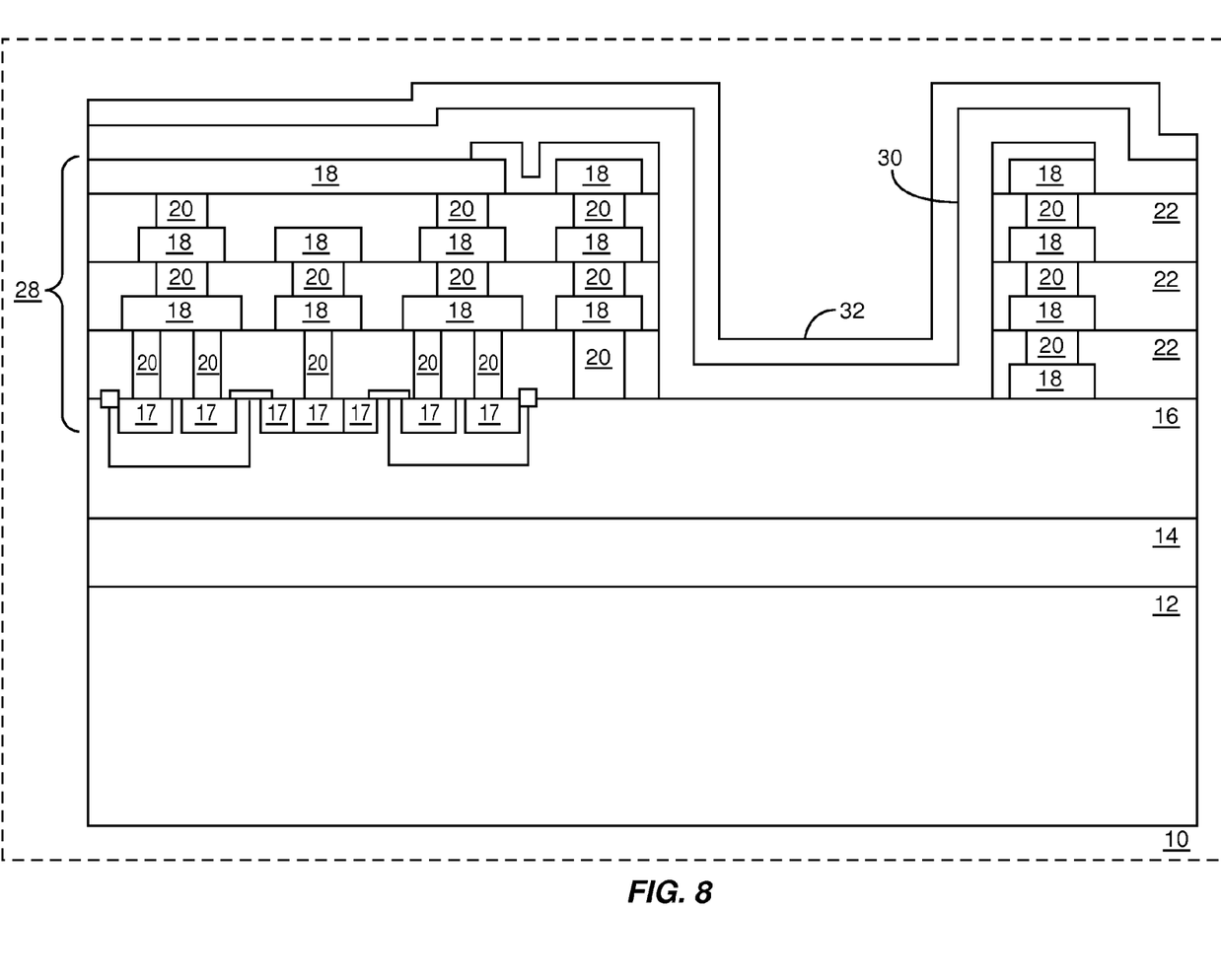
FIG. 8 illustrates fabrication of imprint material added to the MEMS device section of the SOI wafer of FIG. 7.
Figure 9:
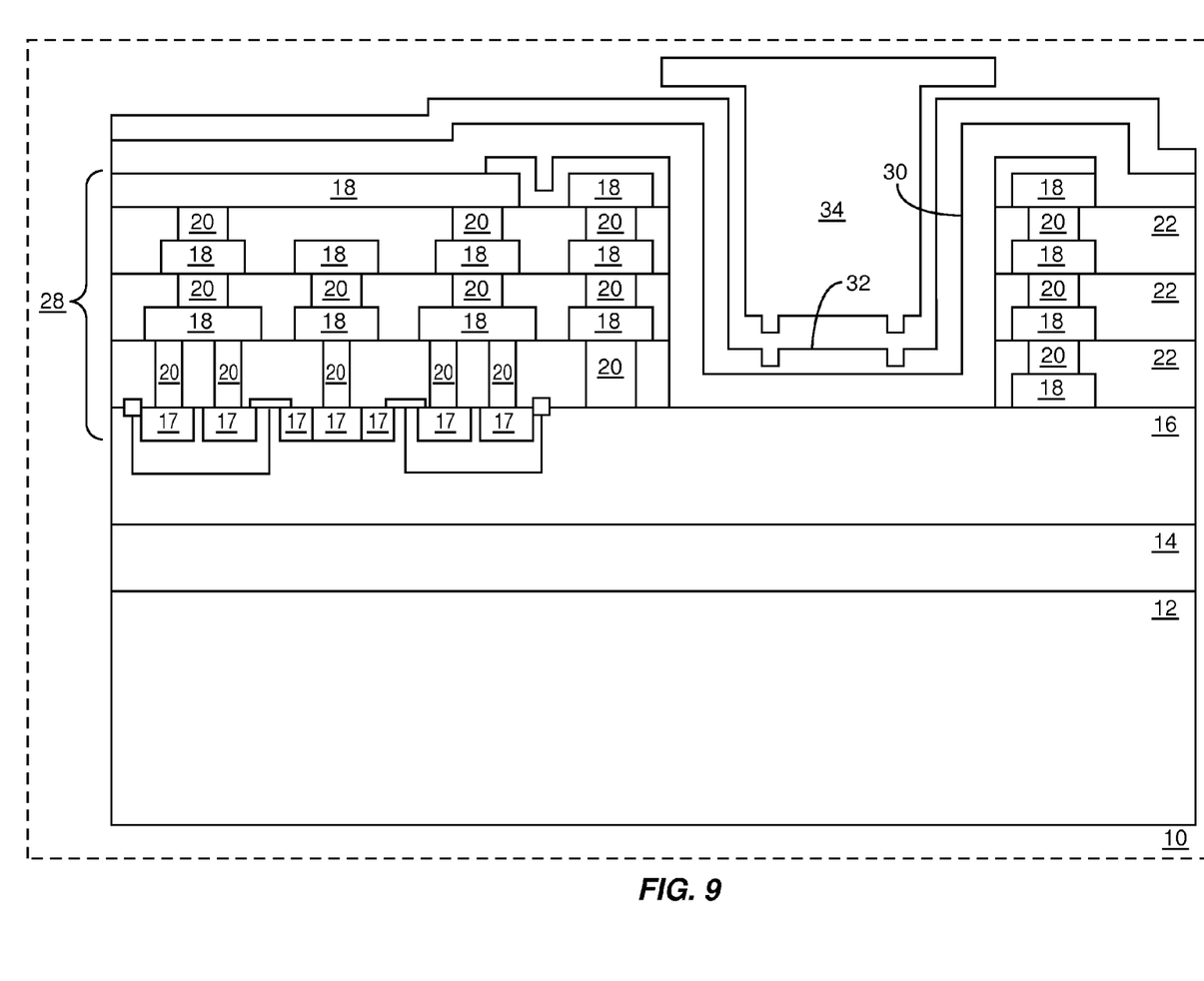
FIG. 9 illustrates fabrication of an imprint of the MEMS disk resonator in the imprint material made by a stamp.
Figure 10:
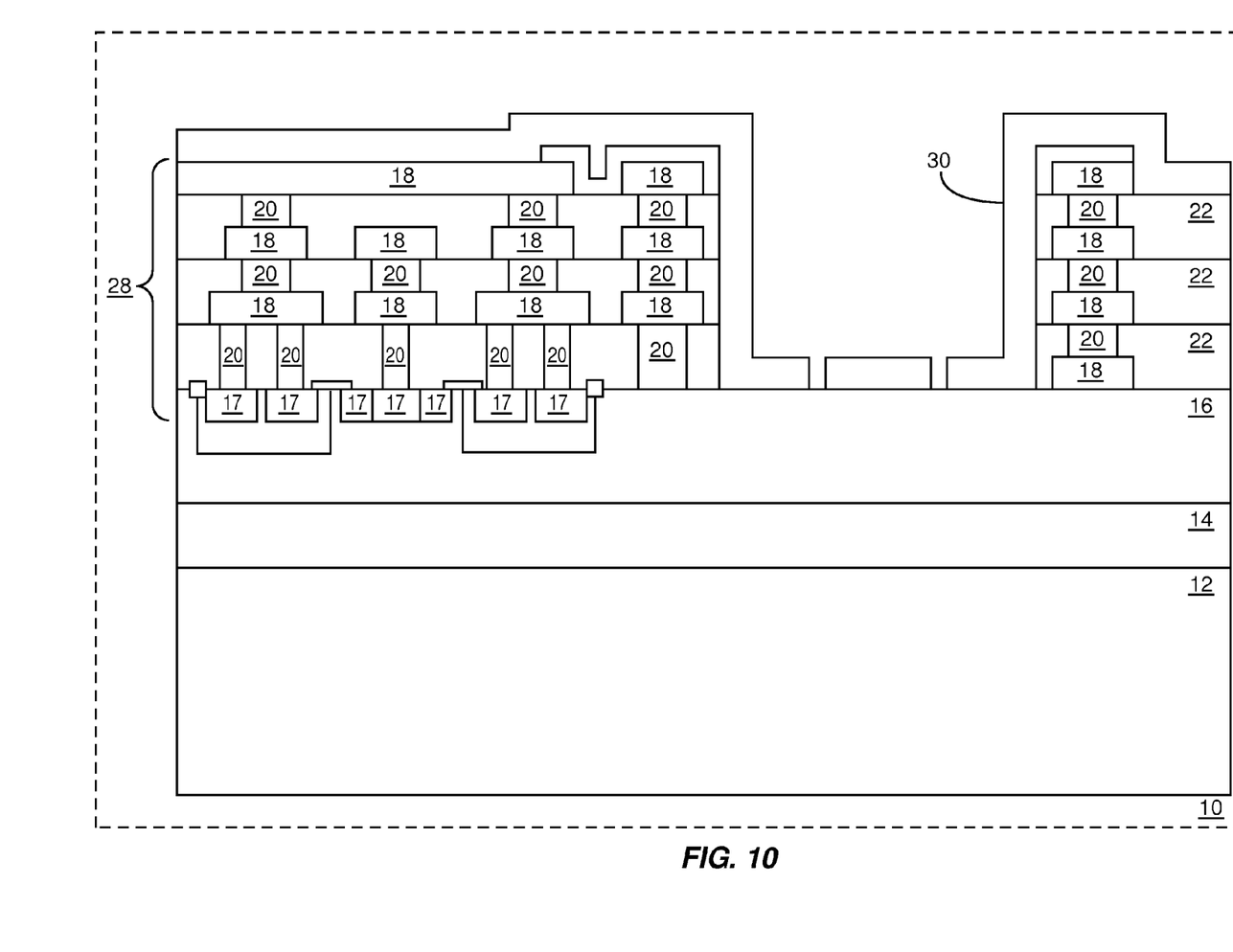
FIG. 10 illustrates fabrication of the SOI wafer of FIG. 9 after dry etching the imprint of the MEMS disk resonator through the imprint material down to the SOI device layer.
Figure 11:
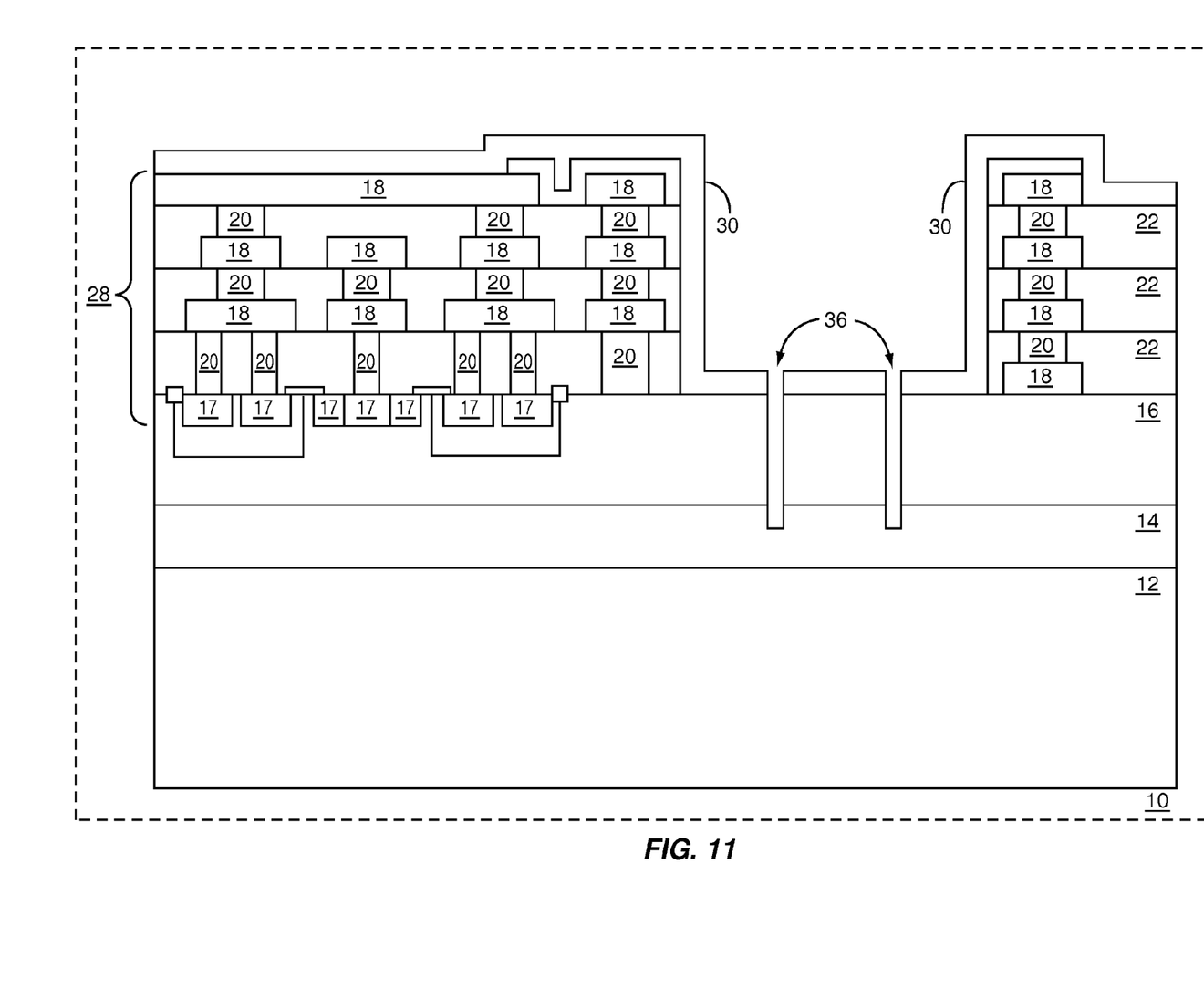
FIG. 11 illustrates fabrication of the SOI wafer of FIG. 10 after dry etching the imprint of the MEMS disk resonator through the SOI device layer down to the SOI buried oxide layer to form the resonator gaps.
Figure 12:
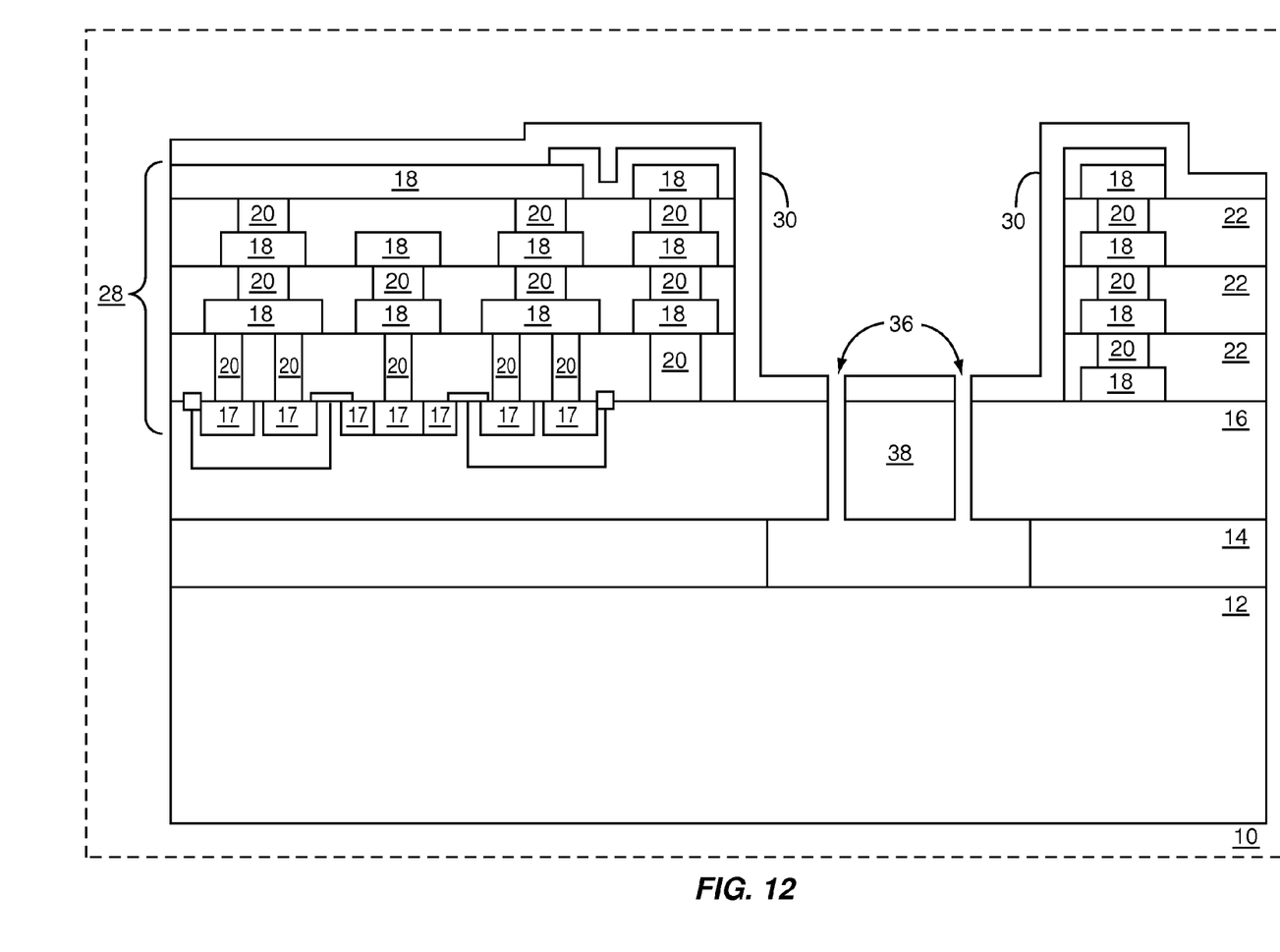
FIG. 12 illustrates fabrication of the SOI wafer of FIG. 11 after wet etching the SOI buried oxide layer to release the disk resonator structure.

A hard mask 30 is applied to the exposed layers of the SOI wafer 10 (Step 110, FIG. 7). Then, an imprint material 32 is applied to the SOI wafer 10 (Step 112, FIG. 8). A disk resonator pattern is imprinted in the imprint material 32 using a stamp 34 (Step 114, FIG. 9). In one embodiment of the present invention, the stamp may include quartz. The disk resonator pattern is etched using a dry etching technique through the imprint material 32 and the hard mask 30 (Step 116, FIG. 10). Any remaining imprint material 32 may be removed after the completion of Step 116. Dry etching refers to the removal of material by exposing the material to a bombardment of ions that dislodge portions of the material from the exposed surface. Unlike wet etching, techniques used in the dry etching process can etch directionally, or anisotropically The disk resonator pattern is dry etched through the SOI device layer 16 down to the SOI buried oxide layer 14 to form resonator gaps 36 (Step 118, FIG. 11). The hard mask 30 protects the deposition layers and the rest of the SOI wafer 10 during the etching processes. The SOI buried oxide layer 14 is then wet etched to release a disk resonator structure 38 (Step 120, FIG. 12). Any remaining hard mask material may be removed after the completion of Step 120. The SOI buried oxide layer 14 is a sacrificial material, which is sacrificed to release the disk resonator structure 38. Alternate embodiments of the present invention may use other sacrificial materials to release a MEMS device structure.

Wet etching is an etching process that utilizes chemicals or etchants to remove materials selectively from the SOI wafer 10. Materials not covered by a hard mask or other protective material and susceptible to the chemicals or etchants are etched away, while those materials covered by the hard mask are left almost intact. The wet etching process typically etches equally in all directions, or isotropically. In one embodiment of the present invention, dielectric material (not shown) is added to the resonator gaps 36. The dielectric material may increase the capacitance between the disk resonator structure 38 and the surrounding structure. The increase in capacitance may be useful in some applications. Alternate embodiments of the present invention may use other techniques to create the MEMS disk resonator on the SOI device layer 16. Alternate lithography materials, lithography techniques, pattern addition, and etching methods may be used. Other process steps may be performed between any of the process steps illustrated. In certain embodiments of the present invention, the completed combined MEMS device and IC on an SOI wafer may be separated from the SOI wafer to create a die, may be placed in an IC package, may be mounted to a substrate with at least one other die, may be physically protected, may be environmentally protected, or any combination thereof.

Figure 13:
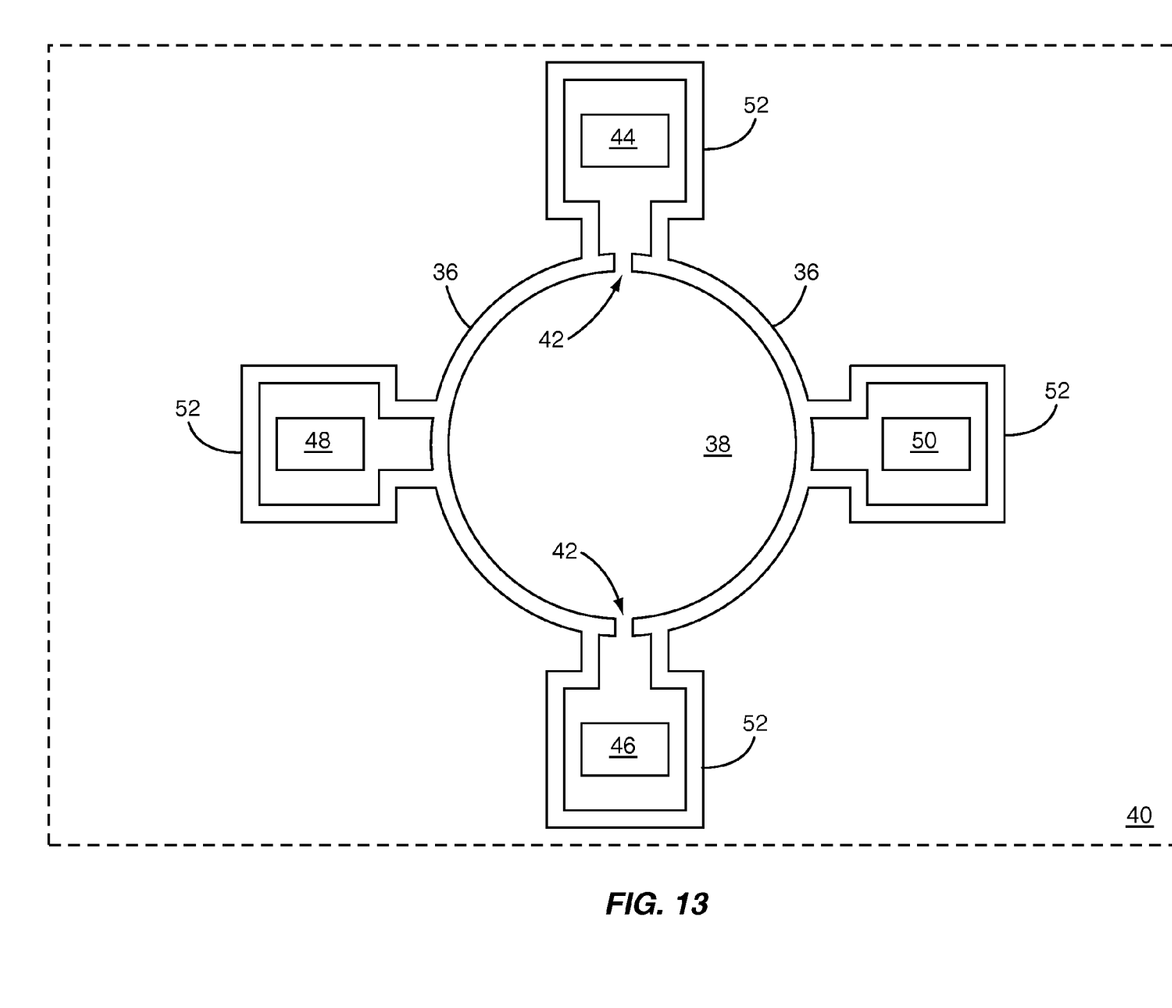
FIG. 13 shows a top view of a MEMS disk resonator.

FIG. 13 shows a top view of an RF MEMS disk resonator 40, which has been formed using the method illustrated in FIG. 2. The disk resonator structure 38 is surrounded by the resonator gaps 36, and is anchored at the top and bottom by anchors 42. A positive direct current (DC) bias is applied to a top connection 44 and a bottom connection 46. A negative DC bias is applied to an RF input 48 and an RF output 50, which traverse the left and right of the disk resonator structure 38. Isolation trenches 52 isolate the RF MEMS disk resonator 40 from other circuitry. When biased with a DC bias signal, the RF MEMS disk resonator 40 may have electrical characteristics across its RF input and output 48, 50 that make it useful to combine with IC circuitry to create RF circuits such as an RF bandpass filter an RF oscillator, or an RF transceiver circuit.

Figure 14:
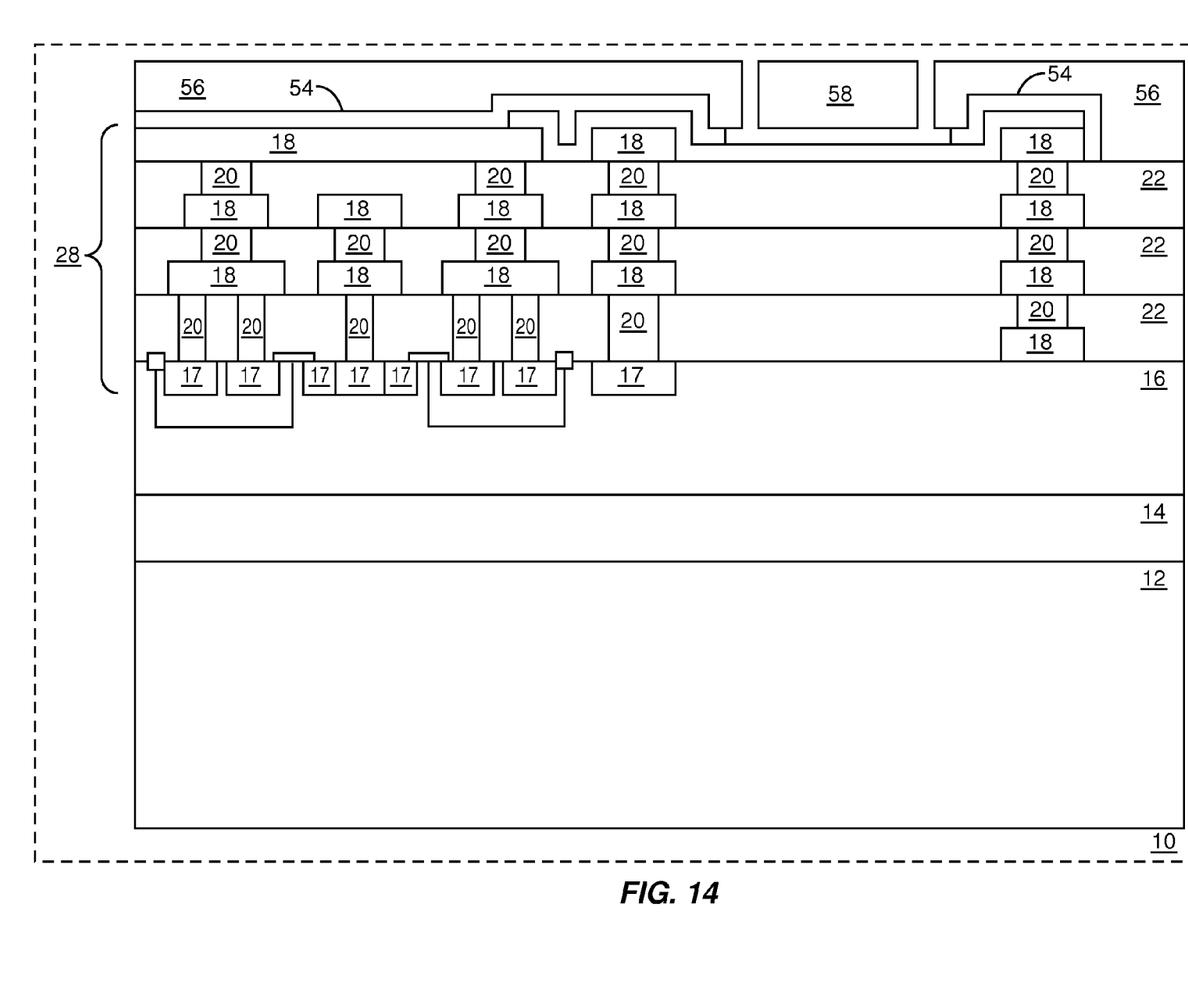
FIG. 14 shows an alternate embodiment of the present invention, wherein a MEMS disk resonator is formed by adding and etching a MEMS device layer on top of back end layers.

FIG. 14 shows an alternate embodiment of the present invention, wherein a MEMS disk resonator 40 is formed by adding and etching a MEMS sacrificial layer 54 and a MEMS device layer 56 on top of the deposition layers. The MEMS sacrificial layer 54 may include an oxide material. The MEMS device layer 56 may include polycrystalline silicon (poly-silicon), silicon germanium (SiGe), diamond, or any combination thereof. A disk resonator structure 58 may be formed using a method similar to Steps 110 through 120 of the method illustrated in FIG. 2.

Figure 15:
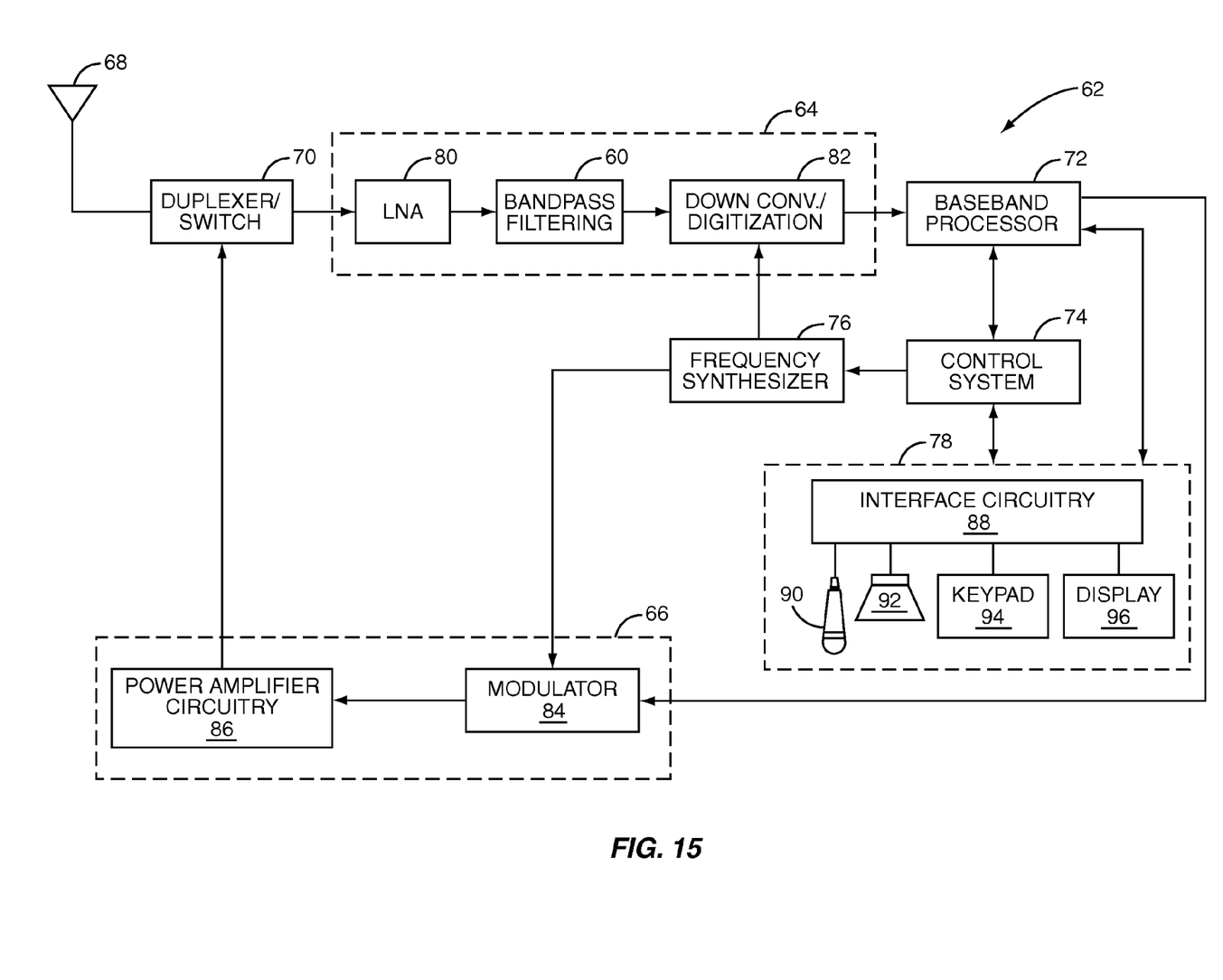
FIG. 15 shows an application example of the present invention used in a mobile terminal.

An application example of a combined IC and MEMS disk resonator is its use as a bandpass filter 60 in a mobile terminal 62. The basic architecture of the mobile terminal 62 is represented in FIG. 15 and may include a receiver front end 64, a radio frequency transmitter section 66, an antenna 68, a duplexer or switch 70, a baseband processor 72, a control system 74, a frequency synthesizer 76, and an interface 78. The receiver front end 64 receives information bearing radio frequency signals from one or more remote transmitters provided by a base station. A low noise amplifier (LNA) 80 amplifies the signal. The bandpass filter 60 minimizes broadband interference in the received signal, while down conversion and digitization circuitry 82 down converts the filtered, received signal to an intermediate or baseband frequency signal, which is then digitized into one or more digital streams. The receiver front end 64 typically uses one or more mixing frequencies generated by the frequency synthesizer 76. The baseband processor 72 processes the digitized received signal to extract the information or data bits conveyed in the received signal. This processing typically comprises demodulation, decoding, and error correction operations. As such, the baseband processor 72 is generally implemented in one or more digital signal processors (DSPs).

On the transmit side, the baseband processor 72 receives digitized data, which may represent voice, data, or control information, from the control system 74, which it encodes for transmission. The encoded data is output to the transmitter 66, where it is used by a modulator 84 to modulate a carrier signal that is at a desired transmit frequency. Power amplifier circuitry 86 amplifies the modulated carrier signal to a level appropriate for transmission, and delivers the amplified and modulated carrier signal to the antenna 68 through the duplexer or switch 70.

A user may interact with the mobile terminal 62 via the interface 78, which may include interface circuitry 88 associated with a microphone 90, a speaker 92, a keypad 94, and a display 96. The interface circuitry 88 typically includes analog-to-digital converters, digital-to-analog converters, amplifiers, and the like. Additionally, it may include a voice encoder/decoder, in which case it may communicate directly with the baseband processor 72. The microphone 90 will typically convert audio input, such as the user's voice, into an electrical signal, which is then digitized and passed directly or indirectly to the baseband processor 72. Audio information encoded in the received signal is recovered by the baseband processor 72, and converted by the interface circuitry 88 into an analog signal suitable for driving the speaker 92. The keypad 94 and display 96 enable the user to interact with the mobile terminal 62, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A method for fabricating a combined micro-electromechanical systems (MEMS) device and integrated circuit (IC) on a silicon-on-insulator (SOI) wafer comprising:
   providing the SOI wafer comprising an SOI device layer over an SOI buried oxide layer;
   forming at least one deposition layer over the SOI device layer;
   forming at least one electronic component of the IC using the SOI device layer and the at least one deposition layer;
   etching through all of the at least one deposition layer to create a MEMS device section on the SOI device layer;
   after the etching through all of the at least one deposition layer, applying a hard mask to a surface of the SOI wafer;
   applying imprint material over the hard mask to the MEMS device section;
   imprinting a MEMS device pattern in the imprint material using a stamp; and
   dry etching the MEMS device pattern through the imprint material and through the hard mask down to the SOI device layer.

2. The method of claim 1 further comprising after the dry etching the MEMS device pattern through the imprint material and through the hard mask, dry etching the MEMS device pattern through the SOI device layer down to the SOI buried oxide layer to form MEMS device gaps.

3. The method of claim 2 further comprising after the dry etching the MEMS device pattern through the SOI device layer, wet etching the SOI buried oxide layer to release a MEMS device structure.

4. The method of claim 3 further comprising:
   after the forming the at least one electronic component and before the etching through all of the at least one deposition layer, applying a photo resist to a top layer of the at least one deposition layer; and
   after the applying the photo resist, exposing the photo resist to form a desired pattern.

5. The method of claim 4 further comprising after the etching through all of the at least one deposition layer, removing any remaining photo resist material.

6. A method for fabricating a combined micro-electromechanical systems (MEMS) disk resonator and integrated circuit (IC) on a silicon-on-insulator (SOI) wafer comprising:
   providing the SOI wafer comprising an SOI device layer over an SOI buried oxide layer;
   forming at least one deposition layer over the SOI device layer;
   forming at least one electronic component of the IC using the SOI device layer and the at least one deposition layer;
   etching through all of the at least one deposition layer to create a MEMS device section on the SOI device layer;
   after the etching through all of the at least one deposition layer, applying a hard mask to a surface of the SOI wafer;
   applying imprint material over the hard mask to the MEMS device section;
   imprinting a disk resonator pattern in the imprint material using a stamp; and
   dry etching the disk resonator pattern through the imprint material and through the hard mask down to the SOI device layer.

7. The method of claim 6 further comprising after the dry etching the disk resonator pattern through the imprint material and through the hard mask, dry etching the disk resonator pattern through the SOI device layer down to the SOI buried oxide layer to form disk resonator gaps.

8. The method of claim 7 further comprising after the dry etching the disk resonator pattern through the SOI device layer, wet etching the SOI buried oxide layer to release a disk resonator structure.

9. The method of claim 8 further comprising:
   after the forming the at least one electronic component and before the etching through all of the at least one deposition layer, applying a photo resist to a top layer of the at least one deposition layer; and
   after the applying the photo resist, exposing the photo resist to form a desired pattern.

10. The method of claim 9 further comprising after the etching through all of the at least one deposition layer, removing any remaining photo resist material.

11. A method for fabricating a combined micro-electromechanical systems (MEMS) device and integrated circuit (IC) on a silicon-on-insulator (SOI) wafer comprising:
   providing the SOI wafer comprising an SOI device layer over an SOI buried oxide layer;
   forming at least one deposition layer over the SOI device layer;
   forming at least one electronic component of the IC using the SOI device layer and the at least one deposition layer;
   etching through all of the at least one deposition layer to create a MEMS device section on the SOI device layer;
   after the etching through all of the at least one deposition layer, applying imprint material to the MEMS device section;
   imprinting a MEMS device pattern in the imprint material using a stamp; and
   dry etching the MEMS device pattern through the imprint material down to the SOI device layer.

12. The method of claim 11 further comprising after the dry etching the MEMS device pattern through the imprint material, dry etching the MEMS device pattern through the SOI device layer down to the SOI buried oxide layer to form MEMS device gaps.

13. The method of claim 12 further comprising after the dry etching the MEMS device pattern through the SOI device layer, wet etching the SOI buried oxide layer to release a MEMS device structure.

14. The method of claim 13 further comprising:
   after the forming the at least one electronic component and before the etching through all of the at least one deposition layer, applying a photo resist to a top layer of the at least one deposition layer; and
   after the applying the photo resist, exposing the photo resist to form a desired pattern.

15. The method of claim 14 further comprising after the etching through all of the at least one deposition layer, removing any remaining photo resist material.

16. The method of claim 11 wherein the MEMS device is a MEMS disk resonator and the MEMS device pattern is a disk resonator pattern.

17. The method of claim 16 further comprising after the dry etching the disk resonator pattern through the imprint material, dry etching the disk resonator pattern through the SOI device layer down to the SOI buried oxide layer to form disk resonator gaps.

18. The method of claim 17 further comprising after the dry etching the disk resonator pattern through the SOI device layer, wet etching the SOI buried oxide layer to release a disk resonator structure.

19. The method of claim 18 further comprising:
   after the forming the at least one electronic component and before the etching through all of the at least one deposition layer, applying a photo resist to a top layer of the at least one deposition layer; and
   after the applying the photo resist, exposing the photo resist to form a desired pattern.

20. The method of claim 19 further comprising after the etching through all of the at least one deposition layer, removing any remaining photo resist material.

\* \* \* \* \*